United States Patent
Demaray et al.

(10) Patent No.: US 7,404,877 B2
(45) Date of Patent: *Jul. 29, 2008

(54) LOW TEMPERATURE ZIRCONIA BASED THERMAL BARRIER LAYER BY PVD

(75) Inventors: Richard E. Demaray, Portola Valley, CA (US); Vassiliki Milonopoulou, San Jose, CA (US)

(73) Assignee: SpringWorks, LLC, Minnetonka, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/291,179

(22) Filed: Nov. 8, 2002

(65) Prior Publication Data

US 2003/0134054 A1      Jul. 17, 2003

Related U.S. Application Data

(60) Provisional application No. 60/337,938, filed on Nov. 9, 2001.

(51) Int. Cl.
*C23C 14/34* (2006.01)

(52) U.S. Cl. .............................. 204/192.15; 204/192.16; 204/192.22

(58) Field of Classification Search ............ 204/192.15, 204/192.16, 192.22; 419/20, 42, 48, 49
See application file for complete search history.

(56) References Cited

U.S. PATENT DOCUMENTS

| | | | |
|---|---|---|---|
| 3,309,302 A | 3/1967 | Heil | |
| 3,616,403 A | 10/1971 | Collins et al. | |
| 3,850,604 A | 11/1974 | Klein | |
| 4,082,569 A | 4/1978 | Evans, Jr. | |
| 4,111,523 A | 9/1978 | Kaminow et al. | |
| 4,437,966 A | 3/1984 | Hope et al. | |
| 4,587,225 A * | 5/1986 | Tsukuma et al. ............ | 501/105 |
| 4,619,680 A | 10/1986 | Nourshargh et al. | |

(Continued)

FOREIGN PATENT DOCUMENTS

DE          37 38 738 C1       1/1989

(Continued)

OTHER PUBLICATIONS

"Morphological and electrical properties of rf sputtered Y2O3-doped ZrO2 thin films", Greene et al., J. Vac. Sci. Tecnol., vol. 13 No. 1, Jan./Feb. 1976 pp. 72-75.*

(Continued)

*Primary Examiner*—Rodney G McDonald
(74) *Attorney, Agent, or Firm*—Finnegan, Henderson, Farabow, Garrett & Dunner, L.L.P.

(57) ABSTRACT

Formation of a zirconia based thermal barrier layer is described. In accordance with the present invention, a thermal barrier layer composed of zirconia or an allow of zirconia is presented. An advantageous layer might be composed of zirconia or an alloy of zirconia with silica having improved properties. In some embodiments, such a zirconia layer might be deposited with a fraction of it's zirconia in a metallic state. Such a fraction, particularly if it were very low, would act to nucleate crystalline grains of silicon during the recrystallization phase of excimer laser melting due to the formation of point defects of zirconium silicide or other nucleating compound or formation. Heat treating the Zirconia layer anneals the Zirconia layer so that it can act as a gate oxide.

6 Claims, 6 Drawing Sheets

U.S. PATENT DOCUMENTS

| | | | |
|---|---|---|---|
| RE32,449 E * | 6/1987 | Claussen et al. ............ 501/103 |
| 4,710,940 A | 12/1987 | Sipes, Jr. |
| 4,785,459 A | 11/1988 | Baer |
| 4,915,810 A | 4/1990 | Kestigian et al. |
| 4,978,437 A | 12/1990 | Wirz |
| 5,085,904 A | 2/1992 | Deak et al. |
| 5,107,538 A | 4/1992 | Benton et al. |
| 5,119,460 A | 6/1992 | Bruce et al. |
| 5,173,271 A | 12/1992 | Chen et al. |
| 5,174,876 A | 12/1992 | Buchal et al. |
| 5,196,041 A | 3/1993 | Tumminelli et al. |
| 5,200,029 A | 4/1993 | Bruce et al. |
| 5,206,925 A | 4/1993 | Nakazawa et al. |
| 5,225,288 A | 7/1993 | Beeson et al. |
| 5,237,439 A | 8/1993 | Misono et al. |
| 5,252,194 A | 10/1993 | Demaray et al. |
| 5,287,427 A | 2/1994 | Atkins et al. |
| 5,296,089 A | 3/1994 | Chen et al. |
| 5,303,319 A | 4/1994 | Ford et al. |
| 5,306,569 A | 4/1994 | Hiraki |
| 5,309,302 A | 5/1994 | Vollmann |
| 5,338,625 A | 8/1994 | Bates et al. |
| 5,355,089 A | 10/1994 | Treger |
| 5,381,262 A | 1/1995 | Arima et al. |
| 5,427,669 A | 6/1995 | Drummond |
| 5,433,835 A | 7/1995 | Demaray |
| 5,435,826 A | 7/1995 | Sakakibara et al. |
| 5,457,569 A | 10/1995 | Liou et al. |
| 5,472,795 A * | 12/1995 | Atita ........................ 428/660 |
| 5,475,528 A | 12/1995 | LaBorde |
| 5,478,456 A | 12/1995 | Humpal et al. |
| 5,483,613 A | 1/1996 | Bruce et al. |
| 5,499,207 A | 3/1996 | Miki et al. |
| 5,512,147 A | 4/1996 | Bates et al. |
| 5,538,796 A * | 7/1996 | Schaffer et al. ............ 428/469 |
| 5,555,127 A | 9/1996 | Abdelkader et al. |
| 5,561,004 A | 10/1996 | Bates et al. |
| 5,563,979 A | 10/1996 | Bruce et al. |
| 5,565,071 A | 10/1996 | Demaray et al. |
| 5,569,520 A | 10/1996 | Bates |
| 5,591,520 A | 1/1997 | Migliorini et al. |
| 5,597,660 A | 1/1997 | Bates et al. |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates |
| 5,613,995 A | 3/1997 | Bhandarkar et al. |
| 5,645,626 A | 7/1997 | Edlund et al. |
| 5,654,054 A | 8/1997 | Tropsha et al. |
| 5,654,984 A | 8/1997 | Hershbarger et al. |
| 5,686,360 A | 11/1997 | Harvey, III et al. |
| 5,689,522 A | 11/1997 | Beach |
| 5,693,956 A | 12/1997 | Shi et al. |
| 5,702,829 A | 12/1997 | Paidassi et al. |
| 5,718,813 A | 2/1998 | Drummond |
| 5,719,976 A | 2/1998 | Henry et al. |
| 5,731,661 A | 3/1998 | So et al. |
| 5,738,731 A | 4/1998 | Shindo et al. |
| 5,755,938 A | 5/1998 | Fukui et al. |
| 5,757,126 A | 5/1998 | Harvey, III et al. |
| 5,762,768 A | 6/1998 | Goy et al. |
| 5,771,562 A | 6/1998 | Harvey, III et al. |
| 5,792,550 A | 8/1998 | Phillips et al. |
| 5,811,177 A | 9/1998 | Shi et al. |
| 5,830,330 A | 11/1998 | Lantsman |
| 5,831,262 A | 11/1998 | Greywall et al. |
| 5,841,931 A | 11/1998 | Foresi et al. |
| 5,847,865 A | 12/1998 | Gopinath et al. |
| 5,849,163 A | 12/1998 | Ichikawa et al. |
| 5,853,830 A | 12/1998 | McCaulley et al. |
| 5,855,744 A | 1/1999 | Halsey et al. |
| 5,870,273 A | 2/1999 | Sogabe et al. |
| 5,882,946 A | 3/1999 | Otani |
| 5,900,057 A | 5/1999 | Buchal et al. |
| 5,909,346 A | 6/1999 | Malhotra et al. |
| 5,930,046 A * | 7/1999 | Solberg et al. ............... 359/580 |
| 5,930,584 A | 7/1999 | Sun et al. |
| 5,942,089 A * | 8/1999 | Sproul et al. ........... 204/192.13 |
| 5,948,215 A | 9/1999 | Lantsman |
| 5,952,778 A | 9/1999 | Haskal et al. |
| 5,961,682 A | 10/1999 | Lee et al. |
| 5,966,491 A | 10/1999 | DiGiovanni |
| 5,977,582 A | 11/1999 | Fleming et al. |
| 6,000,603 A | 12/1999 | Koskenmaki et al. |
| 6,001,224 A | 12/1999 | Drummond et al. |
| 6,004,660 A | 12/1999 | Topolski et al. |
| 6,024,844 A | 2/2000 | Drummond et al. |
| 6,045,626 A | 4/2000 | Yano et al. |
| 6,046,081 A | 4/2000 | Kuo |
| 6,051,114 A | 4/2000 | Yao et al. |
| 6,051,296 A | 4/2000 | McCaulley et al. |
| 6,052,397 A | 4/2000 | Jeon et al. |
| 6,057,557 A | 5/2000 | Ichikawa |
| 6,058,233 A | 5/2000 | Dragone |
| 6,071,323 A | 6/2000 | Kawaguchi |
| 6,077,642 A | 6/2000 | Ogata et al. |
| 6,080,643 A | 6/2000 | Noguchi et al. |
| 6,093,944 A | 7/2000 | VanDover |
| 6,106,933 A | 8/2000 | Nagai et al. |
| 6,117,279 A | 9/2000 | Smolanoff et al. |
| 6,117,345 A | 9/2000 | Liu et al. |
| 6,133,670 A | 10/2000 | Rodgers et al. |
| 6,146,225 A | 11/2000 | Sheats et al. |
| 6,154,582 A | 11/2000 | Bazylenko et al. |
| 6,157,765 A | 12/2000 | Bruce et al. |
| 6,162,709 A | 12/2000 | Raoux et al. |
| 6,165,566 A | 12/2000 | Tropsha |
| 6,168,884 B1 | 1/2001 | Neudecker et al. |
| 6,176,986 B1 | 1/2001 | Watanabe et al. |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,214,660 B1 | 4/2001 | Uemoto et al. |
| 6,232,242 B1 * | 5/2001 | Hata et al. ................... 438/762 |
| 6,236,793 B1 | 5/2001 | Lawrence et al. |
| 6,242,129 B1 | 6/2001 | Johnson |
| 6,242,132 B1 | 6/2001 | Neudecker et al. |
| 6,248,291 B1 | 6/2001 | Nakagama et al. |
| 6,248,640 B1 | 6/2001 | Nam |
| 6,261,917 B1 | 7/2001 | Quek et al. |
| 6,268,695 B1 | 7/2001 | Affinito |
| 6,280,585 B1 | 8/2001 | Obinata et al. |
| 6,280,875 B1 | 8/2001 | Kwak et al. |
| 6,281,142 B1 | 8/2001 | Basceri et al. |
| 6,287,986 B1 | 9/2001 | Mihara |
| 6,288,835 B1 | 9/2001 | Nilsson et al. |
| 6,290,821 B1 | 9/2001 | McLeod |
| 6,290,822 B1 | 9/2001 | Fleming et al. |
| 6,300,215 B1 | 10/2001 | Shin |
| 6,302,939 B1 | 10/2001 | Rabin et al. |
| 6,306,265 B1 | 10/2001 | Fu et al. |
| 6,344,419 B1 | 2/2002 | Forster et al. |
| 6,350,353 B2 | 2/2002 | Gopalraja et al. |
| 6,356,694 B1 | 3/2002 | Weber |
| 6,358,810 B1 | 3/2002 | Dornfest et al. |
| 6,361,662 B1 | 3/2002 | Chiba et al. |
| 6,365,300 B1 | 4/2002 | Ota et al. |
| 6,365,319 B1 | 4/2002 | Heath et al. |
| 6,376,027 B1 | 4/2002 | Lee et al. |
| 6,391,166 B1 | 5/2002 | Wang |
| 6,409,965 B1 | 6/2002 | Nagata et al. |
| 6,413,382 B1 | 7/2002 | Wang et al. |
| 6,413,645 B1 | 7/2002 | Graff et al. |

| | | | | |
|---|---|---|---|---|
| 6,416,598 | B1 | 7/2002 | Sircar | |
| 6,423,776 | B1 | 7/2002 | Akkapeddi et al. | |
| 6,433,380 | B2 | 8/2002 | Shin | |
| 6,444,104 | B2 | 9/2002 | Gopalraja et al. | |
| 6,444,750 | B1 | 9/2002 | Touhsaent | |
| 6,452,717 | B1 | 9/2002 | Endo | |
| 6,488,822 | B1 | 12/2002 | Moslehi | |
| 6,497,598 | B2 | 12/2002 | Affinito | |
| 6,506,289 | B2 * | 1/2003 | Demaray et al. | 204/192.26 |
| 6,511,615 | B1 | 1/2003 | Dawes et al. | |
| 6,522,067 | B1 | 2/2003 | Graff | |
| 6,533,907 | B2 | 3/2003 | Demaray et al. | |
| 6,537,428 | B1 | 3/2003 | Xiong et al. | |
| 6,558,836 | B1 | 5/2003 | Whitacre et al. | |
| 6,563,998 | B1 | 5/2003 | Farah et al. | |
| 6,570,325 | B2 | 5/2003 | Graff | |
| 6,576,546 | B2 | 6/2003 | Gilbert et al. | |
| 6,602,338 | B2 | 8/2003 | Chen et al. | |
| 6,605,228 | B1 | 8/2003 | Kawaguchi et al. | |
| 6,615,614 | B1 | 9/2003 | Makikawa et al. | |
| 6,632,563 | B1 | 10/2003 | Krasnov et al. | |
| 6,673,716 | B1 | 1/2004 | D'Couto et al. | |
| 6,683,244 | B2 | 1/2004 | Fujimori et al. | |
| 6,683,749 | B2 | 1/2004 | Daby et al. | |
| 6,750,156 | B2 | 6/2004 | Le et al. | |
| 6,760,520 | B1 | 7/2004 | Medin et al. | |
| 6,768,855 | B1 | 7/2004 | Bakke et al. | |
| 6,818,356 | B1 | 11/2004 | Bates | |
| 6,827,826 | B2 | 12/2004 | Demaray et al. | |
| 6,846,765 | B2 | 1/2005 | Imamura et al. | |
| 6,884,327 | B2 | 4/2005 | Pan et al. | |
| 7,262,131 | B2 | 8/2007 | Narasimhan et al. | |
| 2001/0027159 | A1 | 10/2001 | Kaneyoshi | |
| 2001/0031122 | A1 | 10/2001 | Lackritz et al. | |
| 2001/0034106 | A1 | 10/2001 | Moise et al. | |
| 2001/0041460 | A1 | 11/2001 | Wiggins | |
| 2002/0001746 | A1 | 1/2002 | Jenson | |
| 2002/0014406 | A1 | 2/2002 | Takashima | |
| 2002/0033330 | A1 | 3/2002 | Demaray et al. | |
| 2002/0076133 | A1 | 6/2002 | Li et al. | |
| 2002/0106297 | A1 | 8/2002 | Ueno et al. | |
| 2002/0115252 | A1 | 8/2002 | Haukka et al. | |
| 2002/0134671 | A1 | 9/2002 | Demaray et al. | |
| 2002/0140103 | A1 | 10/2002 | Kloster et al. | |
| 2002/0170821 | A1 | 11/2002 | Sandlin et al. | |
| 2003/0019326 | A1 | 1/2003 | Han et al. | |
| 2003/0022487 | A1 | 1/2003 | Yoon et al. | |
| 2003/0035906 | A1 | 2/2003 | Memarian et al. | |
| 2003/0042131 | A1 | 3/2003 | Johnson | |
| 2003/0063883 | A1 | 4/2003 | Demaray et al. | |
| 2003/0077914 | A1 | 4/2003 | Le et al. | |
| 2003/0079838 | A1 | 5/2003 | Brcka | |
| 2003/0097858 | A1 | 5/2003 | Strohhofer et al. | |
| 2003/0127319 | A1 | 7/2003 | Demaray et al. | |
| 2003/0134054 | A1 | 7/2003 | Demaray et al. | |
| 2003/0141186 | A1 | 7/2003 | Wang et al. | |
| 2003/0173207 | A1 | 9/2003 | Zhang et al. | |
| 2003/0173208 | A1 | 9/2003 | Pan et al. | |
| 2003/0174391 | A1 | 9/2003 | Pan et al. | |
| 2003/0175142 | A1 | 9/2003 | Milonopoulou et al. | |
| 2003/0178637 | A1 | 9/2003 | Chen et al. | |
| 2003/0185266 | A1 | 10/2003 | Henrichs | |
| 2004/0043557 | A1 | 3/2004 | Haukka et al. | |
| 2004/0077161 | A1 | 4/2004 | Chen et al. | |
| 2004/0105644 | A1 | 6/2004 | Dawes | |
| 2004/0259305 | A1 | 12/2004 | Demaray et al. | |
| 2005/0000794 | A1 | 1/2005 | Demaray et al. | |
| 2005/0006768 | A1 | 1/2005 | Narasimhan et al. | |
| 2005/0048802 | A1 | 3/2005 | Zhang et al. | |
| 2005/0183946 | A1 | 8/2005 | Pan et al. | |
| 2006/0054496 | A1 | 3/2006 | Zhang et al. | |
| 2006/0057283 | A1 | 3/2006 | Zhang et al. | |
| 2006/0057304 | A1 | 3/2006 | Zhang et al. | |
| 2006/0071592 | A1 | 4/2006 | Narasimhan et al. | |
| 2006/0134522 | A1 | 6/2006 | Zhang et al. | |
| 2007/0053139 | A1 | 3/2007 | Zhang et al. | |

FOREIGN PATENT DOCUMENTS

| | | | | |
|---|---|---|---|---|
| EP | 0 510 883 | A2 | | 10/1992 |
| EP | 0 652 308 | A2 | | 10/1994 |
| EP | 0 639 655 | A1 | | 2/1995 |
| EP | 0 820 088 | A2 | | 1/1998 |
| EP | 0 867 985 | B1 | | 9/1998 |
| EP | 1068899 | A1 | | 1/2001 |
| EP | 1 092 689 | A1 | | 4/2001 |
| EP | 1 189 080 | A2 | | 3/2002 |
| JP | 2-054764 | A2 | | 2/1990 |
| JP | 5-230642 | A | | 9/1993 |
| JP | 6-010127 | A | | 1/1994 |
| JP | 6-100333 | A | | 12/1994 |
| JP | 7-224379 | A | | 8/1995 |
| JP | 7-233469 | | | 9/1995 |
| KR | 2002-26187 | | | 4/2002 |
| WO | WO 96/23085 | | | 8/1996 |
| WO | WO 97/35044 | | | 9/1997 |
| WO | WO 99/61674 | A1 | | 12/1999 |
| WO | WO 00/21898 | A1 | | 4/2000 |
| WO | WO 00/22742 | A2 | | 4/2000 |
| WO | WO 00/36665 | A1 | | 6/2000 |
| WO | WO 01/82297 | A1 | | 11/2001 |
| WO | WO 02/12932 | | * | 2/2002 |
| WO | WO 02/12932 | A2 | | 2/2002 |
| WO | WO 2004/021532 | A1 | | 3/2004 |
| WO | WO 2004/077519 | A2 | | 9/2004 |
| WO | WO 2004/106581 | A2 | | 12/2004 |
| WO | WO 2006/063308 | A2 | | 6/2006 |
| WO | WO 2007/027535 | | | 3/2007 |

OTHER PUBLICATIONS

Tomaszewski et al. "Yttria-stabiled zirconia thin films grown by reactive r.f. magnetron sputtering" Thin Solid Films 287 (1996) pp. 104-109.*

Affinito et al., "PML/oxide/PML Barrier Layer Performance Differences Arising from Use of UV or Electron Beam Polymerization of the PML Layers," *Thin Solid Films* vol. 308-309, pp. 19-25 (1997).

Affinito et al., "Polymer-Oxide Transparent Barrier Layers," Society of Vacuum Coaters, 39th Ann. Technical Conference Proceedings, May 5-10, 1996, Philadelphia, PA, pp. 392-397 (1996).

Alder, T. et al., "High-Efficiency Fiber-to-Chip Coupling Using Low-Loss Tapered Single-Mode Fiber," *IEEE Photonics Technology Letters*, 12(8):1016-1018 (2000).

Almeida, Vilson R. et al., "Nanotaper for compact mode conversion," *Optics Letters*, 28(15):1302-1304 (2003).

Asghari et al., "ASOC—A Manufacturing Integrated Optics Technology," Part of the SPIE Conference on Integrated Optics Devices III, vol. 3620, pp. 252-262 (Jan. 1999).

Barbier et al, "Amplifying Four-Wavelength Combiner, Based on Erbium/Etterbium-Doped Waveguide Amplifiers and Integrated Splitters", *IEEE Photonics Technology Lettters*, vol. 9, pp. 315-317, 1997, 4 pages.

Barbier, Denis, "Performances and potential applications of erbium doped planar waveguide amplifiers and lasers," GeeO, pp. 58-66 (date unknown).

Beach R.J., "Theory and optimization of lens ducts," *Applied Optics*, 35:12:2005-15 (1996).

Belkind et al., "Using pulsed direct current power for reactive sputtering of $Al_2O_3$," *J. Vac. Sci. Technol.* A 17(4), pp. 1934-40 (Jul. 1999).

Bestwick, T., "ASOC silicon integrated optics technology," Part of the SPIE Conferences on Photonics Packaging and Integration, SPIE vol. 3631, pp. 182-190 (Jan. 1999).

Borsella et al., "Structural incorporation of silver insoda-lime glass by the ion-exchange process: a photoluminescence spectroscopy study", *Applied Physics* A 71, pp. 125-132 (2000).

Byer et al., "Nonlinear Optics and Solid-state Lasers," *IEEE Journal on Selected Topics in Quantum Electronics*, vol. 6, No. 6, pp. 921-929 (Nov. 2000).

Campbell et al., "Titanium dioxide ($TiO_2$)-based gate insulators," *IBM J. Res. Develop.* 43(3), 383-391, (May 1999).

Chang, C.Y. (edited by), "ULSI Technology," The McGraw-Hill Companies, Inc., New York, 1996, Chapter 4, pp. 169-170, 226-231 (1996).

Chen et al. "Development of Supported Bifunctional Electrocatalysts for Unitized Regenerative Fuel Cells," *Journal of the Electrochemical Society*, 149(8), A1092-99, (2002).

Choi et al., "Er-Al-codoped silicate planar light waveguide-type amplifier fabricated by radio-frequency sputtering," *Optics Letters*, vol. 25, No. 4, pp. 263-265 (Feb. 15, 2000).

Cooksey et al. "Predicting Permeability & Transmission Rate for Multilayer Materials," *Foodtechnology*, vol. 53, No. 9, pp. 60-63 (Sep. 1999).

Crowder, et al., "Low-Temperature Single-Crystal Si TFT's Fabricated on Si Films Processed via Sequential Lateral Solidification," IEEE, vol. 19, No. 8 (Aug. 1998), pp. 306-308.

Delavaux et al., "Integrated optics erbium ytterbium amplifier system in 10 Gb/s fiber transmission experiment", 22nd European Conference on Optical Communication—ECOC' 96, Oslo, 4 pages (1996).

Distributed Energy Resources: Fuel Cells, Projects, http://www.eere.energy.gov/der/fuel_cells/projects.html (2003).

DuPont Teijin Films, Mylar 200 SBL 300, Product Information (2000).

Electrometals Technologies Limited, Financial Report for the year 2002, Corporate Directory, Chairman's Review, Review of Operations (2002).

E-Tek website: FAQ, Inside E-Tek, E-Tek News, Products; http://www.etek-inc.com/ (2003).

Flytzanis et al, "nonlinear Optics in Composite Materials," E. Wolf, Progress in Optics XXIX (c) Elsevier Scince Publishers B.V., pp. 323-425 (1991).

Frazao et al., "EDFA Gain Flattening Using Long-Period Fibre Gratings Based on the Electric Arc Technique," (date unknown).

Fujii et al, "1.54 mm photoluminescence of $Er^{3+}$ doped into $SiO_2$ films containing Si nanocrystals: Evidence for energy transfer from Si nanocrystals for $Er^{3+}$", Appl. Phys. Lett. 71 (9), pp. 1198-1200 (Sep. 1997).

Garcia, C. "Size Dependence of Lifetime and Absorption Cross Section of Si Nanocrystals Embedded in $SiO_2$," Appl. Phys. Lett., vol. 82, No. 10, pp. 1595-1597 (Mar. 2003).

Goossens et al., "Sensitization of $TiO_2$ with p-type semiconductor polymers," Delft Interfaculty Research Center, Delft University of Technology Laboratory of Inorganic Chemistry, The Netherlands (1998).

Han, Hak-Seung et al. "Optical Gain at 1.54 □m in Erbium-Doped Silicon Nanocluster Sensitized Waveguide," *Appl. Phys. Lett.*, vol. 79, No. 27, pp. 4568-4570 (Dec. 2001).

Hayakawa et al., "Enhanced fluorescence from $Eu^{3+}$ owing to surface plasma oscillation of silver particles in glass", *Journal of Non-Crystalline Solids*, vol. 259, pp. 16-22 (1999).

Hayakawa et al, "Field enhancement effect of small Ag particles on the fluorescence from $Eu^{3+}$-doped $SiO_2$ glass", *Appl. Phys. Lett.*, vol. 74, No. 11, pp. 1513-1515 (Mar. 1999).

Hayfield, P.C.S., "Development of a New Material-Monolithic Ti4O7 Ebonix Ceramic," Royal Society Chemistry, (2002).

Hehlen et al. "Spectroscopic Properties of $Er^{3+}$- and $Yb^{3+}$-doped Soda-Lime Silicate and Aluminosilicate Glasses," *Physical Review B*, vol. 56, No. 15, pp. 9302-9318 (Oct. 1997).

Hehlen et al. "Uniform Upconversion in High-Concentration $Er^{3+}$-doped Soda Lime Silicate and Aluminosilicate Glasses," *Optics Letters*, vol. 22, No. 11, pp. 772-774 (Jun. 1997).

Horst et al., "Compact, Tunable Optical Devices in Silicon-Oxynitride Wave Guide Technology," IBM Research Division, 3 pages (1999).

Hubner, J. and Guldberg-Kjaer, S., "Planer Er-and Yb-Doped Amplifiers and Lasers," COM Technical University of Denmark, 10.sup.th European Conf. On Integrated Optics, Session WeB2, pp. 71-74 (2001).

Hwang, Man-Soo et al., "The effect of pulsed magnetron sputtering on the properties of indium tin oxide thin films," Elsevier Science B.V., p. 29-33, (2003).

Im, et al. "Controlled Super-lateral Growth of Si Films for Microstructural Manipulation and Optimization," Materials Science Program (1998), pp. 603-617.

Im, et al., "Crystalline Si Films for Integrated Active-Matrix LiquidCrystal Displays," MrS Bulletin (Mar. 1996), pp. 39-48.

Im, et al., "Single-crystal Si films for thin-film transistor devices," American Institute of Physics (1997), pp. 3434-3436.

Itoh, M. et al., "Large reduction of singlemode-fibre coupling loss in 1.5% delta planar lightwave circuits using spot-size converters," *Electronics Letters*, 38(2):72-74 (2002).

Jackson et al. "An Accurate Compact EDFA Model," Dept. of Electrical and Computer Engineering, University of BC (date unknown).

Janssen et al. "Photoinduced electron transfer from conjugated polymers onto nanocrystalline $TiO_2$," Eindhoven University of Technology, The Netherlands (date unknown).

Johnson, J.E. et al., "Monolithically Integrated Semiconductor Optical Amplifier and Electroabsorption Modulator with Dual-Waveguide Spot-Size Converter Input," *IEEE Journal of Selected Topics in Quantum Electronics*, 6(1):19-25, (2000).

Jonsson L.B. et al. "Frequency response in pulsed DC reactive sputtering processes," *Thin Solid Films*, vol. 365, pp. 43-48 (2000).

Kato et al., "Recent progress on PLC hybrid integration," Part of the SPIE Conference on Optoelectric Integrated Circuits III, SPIE. vol. 3631, pp. 28-36 (Jan. 1999).

Kato, Kuniharu et al., "PLC Hybrid Integration Technology and Its Application to Photonic Components," *IEEE Journal of Selected Topics in Quantum Electronics*, 6(1):4-13 (2000).

Kelly et al., "Reactive pulsed magnetron sputtering process for alumina films," *J. Vac. Sci. Technol.* A 18(6), pp. 2890-2896 (Nov. 2000).

Kelly et al., "Control of the structure and properties of aluminum oxide coatings deposited by pulsed magnetron sputtering," *J. Vac. Sci. Technol.* A 17(3), pp. 945-953 (May 1999).

Kik, P.G. et al. "Gain Limiting Processes in Er-doped Si Nanocrystal Waveguides in $SiO_2$," *J. Appl. Phys.*, vol. 91, No. 1, pp. 534-536 (Jan. 1, 2002).

Kim et al. "Frequency-dependent pulsed direct current magnetron sputtering of titanium oxide films," *J. Vac. Sci. Technol.* A 19(2); 429-434 (Mar. 2001).

Kim et al. "Mixture Behavior and Microwave Dielectric Properties in the Low-fired $TiO_2$-CuO System," *Jpn. J. Appl. Phys.*, 39, 2696-2700, (2000).

Ladouceur, F. et al., "8.8 Evaluation of Results", *Silica-based Buried Channel Waveguides and Devices.*, Chapman & Hall, London, pp. 98-99 (1996).

Ladouceur, F. et al., "Effect of side wall roughness in buried channel waveguides," *IEEE Proc.*, vol. 141, pp. 242-248 (Aug. 1994).

Lamb, William B., "Designing Nonfoil Containing Skins for VIP Applications," DuPont VIA Symposium Presenation, (1999).

Lamb, William et al. "Designing Non-Foil Containing Skins for Vacuum InsulationPanel (VIP) Applications," *Vuoto*, vol. XXVIII, No. 1-2—Gennaio-Giugno 1999, pp. 55-58 (1999).

Lange et al, "High Gain Ultra-Short Length Phosphate glass Erbium-Doped Fiber Amplifier Material", OSA Optical Fiber Communications (OFC), 3 pages (2002).

Laporta et al, "Diode-pumped cw bulk Er: Yb: glass laser", 1952 Optics Letters/vol. 16, No. 24/Dec. 15, 6 pages (1991).

Laurent-Lund, C. et al., "PECVD Grown Multiple Core Planar Waveguides with Extremely Low Interface Reflections and Losses," *IEEE Photonics Technology Letters*, vol. 10, No. 10, pp. 1431-1433 (Oct. 1998).

Lee et al., "Effect of size and roughness on light transmission in a S/SiO.sub.2 waveguide: Experiments and model," Department of Materials Science and Engineering, Massachusetts Institute of Technology, (Jul. 12, 2000).

Lee et al. "Effects of interfacial layer growth on the electrical characteristics of thin titanium oxide films on silicon," *Applied Physics Letters*, 74(21), 3143-3145, (May 1999).

Love, J.D. et al., "Quantifying Loss Minimisation in Single-Mode Fibre Tapers," *Electronics Letters*, 22(17):912-914, (1986).

Mardare et al. "On the structure of Titanium Oxide Thin Films," *Analele Stiintifice Ale Universitatii AL. I. Cuza IASI*, vol. XLV-XLVI, 201-208 (1999).

Marques, P.V.S. et al., "Planar Silica-on-Silicon Waveguide Lasers Based in Two Layer Core Devices," 10.sup.th European Conference on Integrated Optics, Session WeB2, pp. 79-82 (2001).

Meijerink et al, Luminescence of $AG^+$ in Crystalline and Glassy $SrB_4O_7$, Journal of Physics and Chemistry of Solids, vol. 54, No. 8, pp. 901-906, (1993).

Mesnaoui et al, "Spectroscopic properties of $AG^+$ ions in phospage glasses of $NaPO_3$-$AgPO_3$ system", European Journal of Solid State and Inorganic Chemistry, vol. 29, pp. 1001-1013, 14 pages (1992).

Mitomi, O. et al., Design of a Single-Mode Tapered Waveguide for Low-Loss Chip-to-Fiber Coupling,: *IEEE Journal of Quantum Electronics*, 30(8):1787-1793, (1994).

Mizuno et al. "Temperature dependence of oxide decomposition on titanium surfaces in UHV," submitted to Journal of Vacuum Science and Technology, (Oct. 28, 2001).

Ohkubo et al., "Polarization-Insensitive Arrayed-Waveguide Grating Using Pure Si)2 Cladding," Fifth Optoelectronics and Communication Conference (OECC 2000) Technical Digest, 2 pages (Jul. 2000).

Ohmi et al., "Rare earth metal oxides for high-K gate insulator," Tokyo Institute of Technology,(date unknown).

Ohtsuki et al., "Gain Characteristics of a high concentration $Er^{3+}$-doped phosphate glass waveguide", *J. Appl. Phys.* 78(6), pp. 3617-3621 (1995).

Ono et al., "Design of a Low-loss Y-branch Optical Waveguide," Fifth Optoelectronic and Communications Conference (OECC 2000) Technical Digest, 2 pages (Jul. 2000).

Padmini et al. "Realization of High Tunability Barium Strontium Titanate Thin Films by RF Magnetron Sputtering," College of Engineering, University of California, Santa Barbara. (date unknown).

Pan et al., "Planar Er3+-doped aluminosilicate waveguide amplifier with more than 10 dB gain across C-band," Optical Society of America, 3 pages (2000).

Peters et al., "Formation mechanism of silver nanocrystals made by ion irradiation of $Na^+$—$Ag^+$ ion-exchanged sodalime silicate glass", Nuclear Instruments and Methods in Physics Research B 168, pp. 237-244 (2000).

Rajarajan, M. et al., "Numerical Study of Spot-Zise Expanders for an Efficient OEIC to SMF Coupling," *IEEE Photonics Technology Letters*, 10(8):1082-1084, (1998).

Ramaswamy et al., "Ion-Exchanged Glass Waveguides: A Review", *Journal of Lightwave Technology*, vol. 6, No. 6, pp. 984-1001 (1988).

Roberts et al., "The Photoluminescence of Erbium-doped Silicon Monoxide," Department of Electronics and Computer Science, 7 pages (Jun. 1996).

Sanyo Vacuum Industries Co., Ltd. Products Info, $TiO_2$, (2003). http://www.sanyovac.co.jp/Englishweb/products/ETiO2.htm.

Schermer, R. et al., "Investigation of Mesa Dielectric Waveguides,", Proceedings of the OSA Integrated Photonics Research Topical Meeting and Exhibit, Paper No. IWB3 (Jun. 2001).

Schiller et al. "PVD Coating of Plastic Webs and Sheets with High Rates on Large Areas," European Materials Research Society 1999 Spring Meeting, Jun. 1-4, 1999, Strasbourg, France (1999).

Second International Symposium of Polymer Surface Modification: Relevance to Adhesion, Preliminary Program (1999).

Seventh International Conference on $TiO_2$ Photocatalysis: Fundamentals & Applications, Toronto, Ontario, Canada, Final Program (Nov. 17-21, 2002).

Sewell, P. et al., "Rib Waveguide Spot-Size Transformers: Modal Properties," *Journal of Lightwave Technology*, 17(5):848-856, (1999).

Shaw et al. "Use of Vapor Deposited Acrlate Coatings to Improve the Barrier Properties of MetallizedFilm," Society of Vacuum Coaters 505/856-7168, 37th Annual Technical Conference Proceedings, pp. 240-244 (1994).

Shin et al. "Dielectric and Electrical Properties of Sputter Grown $(Ba,Sr)TiO_3$ Thin Films," J. Appl. Phys., vol. 86, No. 1, pp. 506-513 (Jul. 1999).

Shmulovich et al., "Recent progress in Erbium-doped waveguide amplifiers," Bell Laboratories, 3 pages (1999).

Slooff et al, "Optical properties of Erbium-doped organic polydentate cage complexes", *J. Appl. Phys.* 83, pp. 497-503 (Jan. 1998).

Smith, R.E., "Reduced Coupling Loss Using a Tapered-Rib Adiabatic-Following Fiber Coupler," *IEEE Photonics Technology Letters*, 8(8):1052-1054 (1996).

Strohhofer, et al. "Energy transfer to $Er^{3+}$ in Ag ion-exchanged glass", FOM Institute for Atomic and Molecular Physics, 10 pages (date unknwon).

Sugiyama et al., "Gas Permeation Through the Pinholes of Plastic Film Laminated with Aluminium Foil," Vuoto, vol. XXVIII, N. 1-2—Gennaio-Guigno (1999).

Tervonen, A., "Challenges and opportunities for integrated optics in optical networks," Part of the SPIE Conference in Integrated Optics Devices III, SPIE vol. 3620, pp. 2-11 (Jan. 1999).

Ting et al., "Study of planarized sputter-deposited SiO2," J. Vac. Sci. Technol., 15(3) pp. 1105-1112 (May/Jun. 1978).

Treichel et al., "The influence of pulsed magnetron sputtering on topography and crystallinity of TiO2 films on glass," *Space and Coatings Technology*, vol. 123, pp. 268-272 (2000).

Tukamoto, H. et al., "Electronic Conductivity of $LiCoO_s$ and Its Enhancement by Magnesium Doping," J. Electrochem. Soc., vol. 44, No. 9, pp. 3164-3168 (Sep. 1997).

Van Dover, R.B. "Amorphous Lanthanide-Doped $TiO_x$ Dielectric Films," Appl. Phys. Lett., vol. 74, No. 20, pp. 3041-3043 (May 1999).

Viljanen et al, "Planar Optical Coupling Elements for Multimode Fibers with Two-Step Ion Migration Process", Applied Physics, 24, No. 1, pp. 61-63 (Jan. 1981).

Villegas et al, "Optical spectroscopy ofa soda lime glass exchanged with silver", Physics and Chemistry of glasses 37(6), pp. 248-253 (1996).

Von Rottkay et al. "Influence of stoichiometry on electrochromic cerium-titanium oxide compounds," Lawrence Berkeley National Laboratory, UC Berkeley, CA, (date unknown).

Westlinder et al. "Simulation and Dielectric Characterization of Reactive dc Magnetron Cosputtered $(Ta_2O_5)_{1-x}(TiO_2)_x$ Thin Films," J. Vac. Sci. Technol. B, vol. 20, No. 3, pp. 855-861 (May/Jun. 2002).

Wilkes, Kenneth T. "Gas Permeation Through Vacuum Barrier Films and its Effect on VIP Thermal Performance," Vacuum Insulation Panel Symp., Baltimore, Maryland, (May 3, 1999).

Yanagawa, H. et al., "Index-and-Dimensional Taper and Its Application to Photonic Devices," *Journal of Lightwave Technology*, 10(5):587-591 (1992).

Yoshikawa, K. et al., "Spray formed aluminium alloys for sputtering targets," *Power Metallurgy*, vol. 43, No. 3 (2000).

Zhang, Hongmei et al. "High Dielectric Strength, High k $TiO_2$ Films by Pulsed DC, Reactive Sputter Deposition," (2001).

Office Action issued on Sep. 27, 2004 in U.S. Appl. No. 10/291,179.

Response to Office Action filed on Mar. 14, 2005 in U.S. Appl. No. 10/291,179.

Office Action issued on Jun. 15, 2005 in U.S. Appl. No. 10/291,179.

Office Action issued on May 2, 2002 in U.S. Pat. No. 6,533,907.

Response to Office Action filed on Sep. 3, 2002 in U.S. Pat. No. 6,533,907.

Office Action issued on Feb. 12, 2004 in U.S. Appl. No. 09/903,081.

Reponse to Office Action filed on Aug. 10, 2004 in U.S. Appl. No. 09/903,081.

Office Action issued on Sep. 10, 2004 in U.S. Appl. No. 09/903,081.

Amendment/RCE filed on Mar. 10, 2005 in U.S. Appl. No. 09/903,081.

Office Action issued on Mar. 17, 2005 in U.S. Appl. No. 09/903,081.

Response to Office Action filed on Jun. 17, 2005 in U.S. Appl. No. 09/903,081.

Office Action issued on Jul. 8, 2005 in U.S. Appl. No. 09/903,081.

Office Action issued on May 14, 2003 in U.S. Appl. No. 10/101,492.

Response to Office Action filed on Aug. 14, 2003 in U.S. Appl. No. 10/101,492.

Office Action issued on Sep. 3, 2003 in U.S. Appl. No. 10/101,492.

Response to Office Action filed on Mar. 3, 2004 in U.S. Appl. No. 10/101,492.

Office Action issued on Feb. 24, 2004 in U.S. Appl. No. 10/101,863.

Response to Office Action filed on Jul. 23, 2004 in U.S. Appl. No. 10/101,863.

Office Action issued on Oct. 6, 2004 in U.S. Appl. No. 10/101,863.
Office Action dated Jan. 13, 2005, received in U.S. Appl. No. 10/101,863.
Response to office Action filed on Jun. 10, 2005 in U.S. Appl. No. 10/101,863.
Office Action dated Mar. 25, 2005, received in U.S. Appl. No. 10/954,182.
Office Action issued on Oct. 22, 2003 in U.S. Appl. No. 10/101,341.
Response to Office Action filed on Feb. 23, 2004 in U.S. Appl. No. 10/101,341.
Office Action issued on Jun. 10, 2004 in U.S. Appl. No. 10/101,341.
Response to Office Action filed on Dec. 8, 2004 in U.S. Appl. No. 10/101,341.
Office Action issued on May 4, 2004 in U.S. Appl. No. 10/101,493.
International Search Report issued on Nov. 21, 2003 in PCT/US03/24809.
Office Action issued on Mar. 14, 2005 in U.S. Appl. No. 10/789,953.
International Search Report issued on Oct. 11, 2004 in PCT/US2004/005531.
Written Opinion issued on Oct. 11, 2004 in PCT/US2004/005531.
Office Action issued Mar. 24, 2005 in U.S. Appl. No. 10/851,542.
Pct international Search Report of Application No. PCT/US2004/014524 dated Mar. 2, 2005.
PCT International Search Report of Application No. PCT/US2004/014523 dated Jan. 17, 2005.
Dorey, R.A., "Low temperature micromoulding of functional ceramic devices," Grant summary for GR/S84156/01 for the UK Engineering and Physical Sciences Research Council, 2 pages (2004).
Howson, R.P., "The reactive sputtering of oxides and nitrides," *Pure & Appl. Chem.* 66(6):1311-1318 (1994).
Office Action issued on Aug. 4, 2005, in U.S. Appl. No. 10/101,863.
Office Action issued on Aug. 8, 2005 in U.S. Appl. No. 10/101,341.
Kim, H-K. and Yoon, Y., "Characteristics of rapid-thermal-annealed $LiCoO_2$ cathode film for an all-solid-state thin film microbattery," *J. Vac. Sci. Technol. A* 22(4):1182-1187 (2004).
PCT Invitation to Pay Additional Fees for PCT/US01/22750, dated Mar. 13, 2002.
PCT International Search Report for PCT/US01/22750, dated Jul. 19, 2002.
PCT Written Opinion for PCT/US01/22750, dated Jul. 23, 2002.
PCT International Preliminary Examination Report for PCT/US01/22750, dated Oct. 8, 2002.
Office Action issued on Nov. 28, 2005 in U.S. Appl. No. 09/903,081.
Response to Office Action filed Feb. 28, 2006 in U.S. Appl. No. 09/903,081.
Office Action issued Sep. 21, 2005 in U.S. Appl. No. 11/100,856.
Response to Office Action filed Feb. 17, 2006 in U.S. Appl. No. 11/100,856.
Response to Office Action filed Dec. 5, 2005, in U.S. Appl. No. 10/101,863.
Final Office Action issued on Feb. 14, 2006, in U.S. Appl. No. 10/101,863.
Response to Office Action filed Feb. 24, 2006, in U.S. Appl. No. 10/101,863.
Office Action mailed Mar. 22, 2006, in U.S. Appl. No. 10/101,863.
Response to Office Action filed on Jul. 25, 2005 in Application No. 10/954,182.
Office Action issued on Oct. 25, 2005, in U.S. Appl. No. 10/954,182.
Response to Office Action filed on Dec. 21, 2005 in U.S. Appl. No. 10/954,182.
Office Action issued on Mar. 9, 2006, in U.S. Appl. No. 10/954,182.
Response to Office Action filed on Nov. 8, 2005, in U.S. Appl. No. 10/101,341.
Office Action issued on Feb. 13, 2006, in U.S. Appl. No. 10/101,341.
Office Action issued on Oct. 3, 2005 in U.S. Appl. No. 10/650,461.
Response to Office Action filed on Jan. 3, 2006 in U.S. Appl. No. 10/650,461.
International Preliminary Examination Report mailed on Apr. 15, 2004 in PCT/US03/24809.
Office Action issued on Dec. 2, 2005 in U.S. Appl. No. 10/789,953.
Response to Office Action filed Mar. 2, 2006 in U.S. Appl. No. 10/789,953.

Specification and Preliminary Amendment as filed for U.S. Appl. No. 11/297,057.
Response to Office Action dated Jul. 25, 2005 in U.S. Appl. No. 10/851,542.
Office Action issued on Oct. 19, 2005 in U.S. Appl. No. 10/851,542.
Response to Office Action filed Jan. 19, 2006 in U.S. Appl. No. 10/851,542.
PCT International Preliminary Report on Patentability for Application No. PCT/US2004/014524, dated Dec. 8, 2005.
PCT Written Opinion for Application No. PCT/US2004/014523 dated Jan. 17, 2005.
PCT International Preliminary Report on Patentability for Application No. PCT/US2004/014523, dated Dec. 8, 2005.
Specification as filed for U.S. Appl. No. 11/297,057.
Agrawal, G.P., in: *Fiber-Optic Communication Systems*, 2nd Edition, John Wiley & Sons, New York, pp. 361-399 and 415 (1997).
*ASM Handbook*, Formerly Ninth Edition, Metals Handbook, vol. 15, Casting, Davis et al. (Eds.), ASM International, pp. 372-373, 376-383, and 410-411 (1988).
Masuda, H. & Kawai, S., "Wide-band and gain-flattened hybrid fiber amplifier consisting of an EDFA and a multiwavelength pumped raman amplifier," *IEEE Photonics Technology Lett.* 11(6):647-649 (1999).
Snoeks, E. et al., "Cooperative upconversion in erbium-implanted soda-lime silicate glass optical waveguides," *J. Opt. Soc. Am. B* 12(8):1468-1474 (1995).
Notice of Allowance issued on Oct. 21, 2004, in U.S. Appl. No. 10/101,492.
Response to Office Action filed on Aug. 9, 2006 in U.S. Appl. No. 10/954,182.
Office Action issued on Aug. 2, 2006, in U.S. Appl. No. 10/101,341.
Cocorullo, G. et al., "Amorphous silicon waveguides and light modulators for integrated photonics realized by low-temperature plasma-enhanced chemical-vapor deposition," *Optics Lett.* 21(24):2002-2004 (1996).
Kelly, P.J. et al., "A novel technique for the deposition of aluminum-doped zinc oxide films," Thin Solid Films 426(I-2):111-116 (2003).
Final Office Action mailed May 8, 2006 in U.S. Appl. No. 09/903,081.
Final Office Action mailed Jun. 9, 2006 in U.S. Appl. No. 11/100,856.
Response to Office Action filed Jun. 12, 2006, in U.S. Appl. No. 10/101,863.
Response to Office Action filed on May 15, 2006, in U.S. Appl. No. 10/101,341.
Office Action issued on Mar. 23, 2006, in U.S. Appl. No. 10/650,461.
Response to Office Action filed on Jul. 24, 2006, in U.S. Appl. No. 10/650,461.
Final Office Action issued on May 19, 2006 in U.S. Appl. No. 10/789,953.
Office Action from Singapore Patent Office in Appl. No. 200505388-9, dated Mar. 20, 2006.
Office Action mailed Apr. 19, 2006 in U.S. Appl. No. 10/851,542.
Response to Office Action filed Jul. 26, 2006 in U.S. Appl. No. 10/851,542.
Specification as filed Sep. 2, 2005, for U.S. Appl. No. 11/218,652.
Office Action mailed Sep. 6, 2006, in U.S. Appl. No. 10/101,863.
Office Action dated Oct. 31, 2006, in U.S. Appl. No. 10/954,182.
Response to Final Office Action filed Aug. 3, 2006, in U.S. Appl. No. 10/789,953.
Notice of Allowance mailed Oct. 23, 2006, in U.S. Appl. No. 10/789,953.
Office Action dated Oct. 12, 2006, for U.S. Appl. No. 11/228,805.
Office Action dated Sep. 22, 2006 from Korean Patent Office in Appl. No. 10-2005-7016055.
Response to Office Action from Singapore Patent Office in Appl. No. 200505388-9, dated Aug. 11, 2006.
Final Office Action dated Oct. 26, 2006, in U.S. Appl. No. 10/851,542.
PCT International Search Report and Written Opinion for Application No. PCT/US05/44781 dated Oct. 3, 2006.
Belkind, A. et al., "Pulsed-DC Reactive Sputtering of Dielectrics: Pulsing Parameter Effects," 43rd Annual Technical Conference Proceedings-Denver: 86-90 (Apr. 15-20, 2000).

Scholl, R., "Power Supplies for Pulsed Plasma Technologies: State-Of-The-Art And Outlook," Advances Energy Industries, Inc., pp. 1-8 (1999).

Scholl, R., "Power Systems for Reactive Sputtering of Insulating Films," Advances Energy Industries, Inc., pp. 1-8 (Aug. 2001).

Response to Office Action dated Feb. 6, 2007, in U.S. Appl. No. 10/101,863.

Response to Office Action dated Dec. 6, 2006, in U.S. Appl. No. 10/954,182.

Supplemental Preliminary Amendment dated Feb. 6, 2007, in U.S. Appl. No. 11/228,834.

Supplemental Preliminary Amendment dated Feb. 6, 2007, in U.S. Appl. No. 11/191,643.

Notice of Allowance dated Feb. 21, 2007, in U.S. Appl. No. 10/789,953.

Response to Office Action dated Dec. 21, 2006, in U.S. Appl. No. 11/228,805.

Response to Office Action dated Nov. 8, 2006, to the Korean Patent Office in Application No. 10-2005-7016055.

Response to Office Action dated Jan. 26, 2007, in U.S. Appl. No. 10/851,542.

Notice of Allowance dated Feb. 22, 2007, in U.S. Appl. No. 10/851,542.

Preliminary Amendment dated Jul. 21, 2006, in U.S. Appl. No. 11/297,057.

Substitute Specification with Markings, Substitute Specification without Markings, and Replacement Drawing Sheets dated Dec. 6, 2006 in U.S. Appl. No. 11/297,057.

Continuation application and Preliminary Amendment dated Dec. 13, 2006.

Response to Office Action dated Mar. 19, 2007, in U.S. Appl. No. 09/903,081.

Response to Office Action dated Mar. 30, 2007, U.S. Appl. No. 10/954,182.

Notice of Allowance dated Mar. 26, 2007, in U.S. Appl. No. 11/228,805.

Supplemental Notice of Allowance dated Mar. 15, 2007, in U.S. Appl. No. 10/851,542.

Voluntary Amendment dated Mar. 8, 2007, in TW Appl. No. 93114518.

Application filed Mar. 22, 2007.

Final Office Action dated May 2, 2007, U.S. Appl. No. 10/101,863.

Response to Final Office Action filed Oct. 2, 2007, in U.S. Appl. No. 10/101,863.

Office Action dated Nov. 15, 2007, in U.S. Appl. No. 10/101,863.

Notice of Non-Compliant Amendment dated Apr. 12, 2007 for U.S. Appl. No. 10/954,182.

Response to Notice of Non-Compliant Amendment filed on Apr. 23, 2007 for U.S. Appl. No. 10/954,182.

Final Office Action dated Jul. 24, 2007, in U.S. Appl. No. 10/954,182.

Amendment/RCE filed Oct. 24, 2007, in U.S. Appl. No. 10/954,182.

Office Action dated Nov. 15, 2007, in U.S. Appl. No. 10/954,182.

Preliminary Amendment dated Sep. 16, 2005, in U.S. Appl. No. 11/228,834.

Preliminary Amendment dated Jul. 27, 2005, in U.S. Appl. No. 11/191,643.

Corrected Preliminary Amendment dated Sep. 19, 2005, in U.S. Appl. No. 11/191,643.

Corrected Notice of Allowance dated Jun. 7, 2007, in U.S. Appl. No. 11/228,805.

Supplemental Notice of Allowance dated Jul. 5, 2007, in U.S. Appl. No. 11/228,805.

Second Supplemental Preliminary Amendment filed on May 31, 2007 for U.S. Appl. No. 11/297,057.

International Preliminary Report on Patentability dated Jun. 21, 2007, in International Application No. PCT/US05/044781.

Response to Office Action dated Dec. 18, 2007, in U.S. Appl. No. 10/101,863.

Notice of Allowance dated Jan. 25, 2008, in U.S. Appl. No. 10/101,863.

Response to Office Action dated Dec. 18, 2007, in U.S. Appl. No. 10/954,182.

Notice of Allowance dated Feb. 1, 2008, in U.S. Appl. No. 10/954,182.

Notice of Allowance dated Jan. 25, 2008, in U.S. Appl. No. 10/101,863.

Notice of Allowance dated Feb. 1, 2008, in U.S. Appl. No. 10/954,182.

Preliminary Amendment dated Mar. 11, 2008, in U.S. Appl. No. 11/228,717.

Notice of Allowance dated Apr. 2, 2008, in U.S. Appl. No. 11/228,717.

Office Action dated Feb. 15, 2008, in U.S. Appl. No. 10/850,968.

Office Action dated Feb. 26, 2008, in U.S. Appl. No. 11/218,652.

PCT International Search Report and Written Opinion for Application No. PCT/US06/33315 mailed Feb. 28, 2008.

* cited by examiner

LOW TEMPERATURE ZIRCONIA BASED THERMAL BARRIER LAYER BY PVD

RELATED APPLICATION

This application claims priority to U.S. Provisional application Ser. No. 60/337,938, filed on Nov. 9, 2001, herein incorporated by reference in its entirety.

BACKGROUND

1. Field of the Invention

The present invention is related to annealing of surface films on low temperature substrates and, in particular, to deposition of low temperature Zirconia Based Thermal Barrier Layer which enables such annealing of surface films.

2. Discussion of Related Art

Many thermal processes for thin films, such as rapid thermal heating or pulsed laser recrystallization, require the surface film to be heated to high temperature for a period of time. Such processing can be carried out on low temperature material such as glass or plastic substrates if a thermal barrier layer is formed between the layer to be treated and the substrate.

One example of such a thermal process is the laser crystallization of amorphous silicon on a low temperature substrate. The recrystallization to form electronic grade poly silicon, requires that the silicon layer be completely melted for a period of time, typically several hundred nano seconds. The completely melted state is referred to as the full melt state (FMS) and the threshold laser power to accomplish such a melted state is referred to as the full melt threshold (FMT).

If the amorphous silicon is deposited directly on a glass substrate, the substrate may be structurally damaged by the high temperature of the liquid silicon in the full melt state. In the case of glass, diffusion of alkali or boron from the glass into the liquid silicon or other harmful diffusion or structural effects may result from the proximity heating of the glass substrate. Clearly low temperature materials such as plastic would be harmed by such a thermal process.

Consequently, a thermal barrier layer or film to isolate the heat affected layer from the substrate is advantageous. Silica is often utilized for this purpose when the substrate is glass. However the thermal conductivity of Silica are poorly matched to glass or plastic substrates and it is known that standard sputtered or CVD deposited silica results in a poor barrier for water or oxygen, and is only a marginal barrier for alkali ions and boron.

Therefore, there is a general need for a vacuum thin film, thermal barrier layer material and process demonstrating lower thermal conductivity and improved electrical and barrier properties.

SUMMARY

In accordance with the present invention, a thermal barrier layer composed of zirconia or an alloy of zirconia is presented. An advantageous layer might be composed of zirconia or an alloy of zirconia with silica having improved thermal and barrier properties.

In some embodiments, such a zirconia layer might be deposited with a fraction of it's zirconia in a metallic state. Such a fraction, particularly if it were very low and at the silicon interface, would act to nucleate crystalline grains of silicon during the recrystallization phase of excimer laser melting due to the formation of point defects of zirconium silicide or other nucleating compound or formation.

In some embodiments, a smooth, amorphous thermal barrier layer composed of zirconium oxide or zirconia or an alloy of zirconia is presented. An advantageous layer might be composed of zirconia or an alloy of zirconia with silica or other compound having improved properties such as thermal resistivity or thermal capacity. In accordance with the present invention, such a zirconium layer can be deposited as a dense, amorphous layer having high dielectric breakdown due to the lack of defects or grain boundaries by a biased PVD process.

These and other embodiments are discussed below with reference to the following figures.

DETAILED DESCRIPTION

Figure 1:
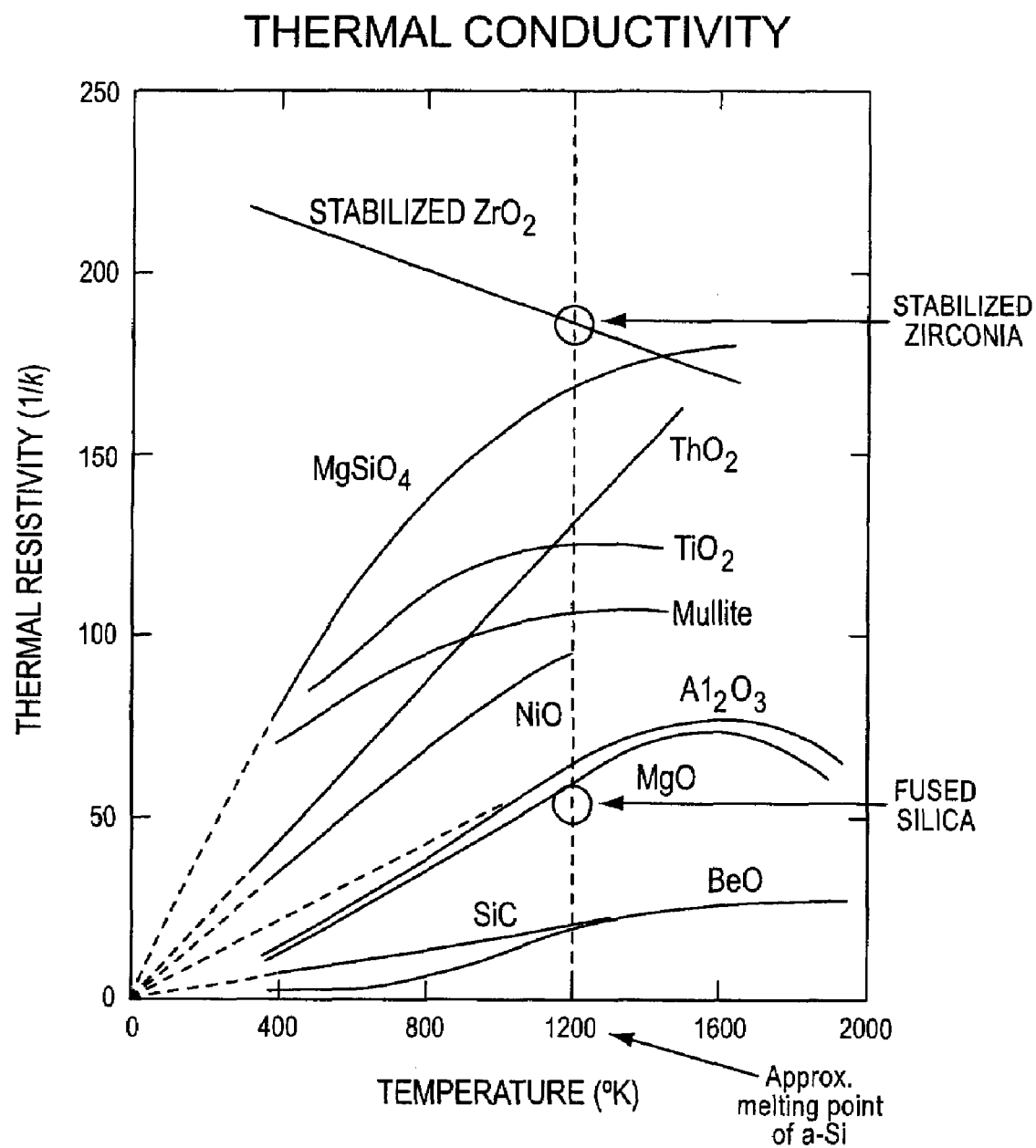
FIG. 1 illustrates the thermal resistivity of various refractory metals and carbide compounds.

FIG. 1 shows the thermal resistivity of several refractory metal and carbide compounds. See, e.g., W. D. KINGERY, INTRODUCTION TO CERAMICS, J. WILEY, 627 (second ed., 1976). As is clearly demonstrated in FIG. 1, stabilized zirconia provides a very high resistivity to heat flow at lower temperatures. In particular, at the melting temperature of amorphous silicon (about 1200 K), stabilized zirconia ($ZrO_2$) has a much higher thermal resistivity than other oxide materials, including $MgSiO_4$, $ThO_2$, $TiO_2$, Mullite, $Al_2O_3$, MgO, SiC, or BeO.

In accordance with the present invention, an amorphous, zirconia thermal barrier layer can be deposited. In addition to providing high thermal resistivity, in some embodiments such a layer can further exhibit selective barrier properties such that oxygen or another gas is permeable but other gaseous or liquid materials are not. An example is that oxygen can be conducted through a zirconia layer by an ionic mechanism which can be accelerated by an electric field or by high temperature. However, other gasses or water are not conducted through zirconia.

In some embodiments, such a layer of zirconia would act as a thermal barrier layer, protecting the underlying substrate from high temperature processes such as laser recrystallization of silicon. In such cases, the silicon layer is temporarily a liquid layer and the substrate material, which is typically a low temperature material such as a glass or plastic material, is easily damaged or impurities are diffused from the low temperature material into the silicon layer, damaging the silicon layer. The thermal layer of zirconia provides both chemical barrier and thermal barrier properties.

In some embodiments, the zirconia layer can also act as a gate oxide after thermal process of an adjacent layer, either above or below. Such a high K or high-dielectric gate oxide can be useful in various aspects of semiconductor device manufacture.

In some embodiments, a zirconia layer can be deposited with a fraction of it's zirconia in a metallic state. Such a fraction of metallic zirconia, particularly if it's concentration were very low, would act to form a compound between the metallic zirconia and a silicon layer, for example. Such a zirconia layer would be advantageous to nucleate crystalline grains of silicon during the recrystallization phase of excimer laser melting due to the formation of point defects of zirconium silicide or other nucleating compound or entity.

Reactive DC magnetron sputtering of nitrides and carbides is a widely practiced technique, but the reactive dc magnetron sputtering of nonconducting oxides is done rarely. Films such as aluminum oxide are almost impossible to deposit by conventional reactive DC magnetron sputtering due to rapid formation of insulating oxide layers on the target surface. The insulating surfaces charges up and result in arcing during process. This arcing can damage the power supply, produce particles and degrade the properties of deposited oxide films.

RF sputtering of oxide films is discussed in application Ser. No. 09/903,050 (the '050 application), filed on Jul. 10, 2001, by Demaray et al., entitled "Planar Optical Devices and Methods for Their Manufacture," assigned to the same assignee as is the present invention, herein incorporated by reference in its entirety. Further, targets that can be utilized in a reactor according to the present invention are discussed in U.S. application Ser. No. 10/101,341, filed on Mar. 16, 2002, assigned to the same assignee as is the present invention, herein incorporated by reference in its entirety. Method of depositing oxides is further discussed in U.S. application Ser. No. 10/101,863, filed on Mar. 16, 2002, assigned to the same assignee as is the present application, herein incorporated by reference in its entirety.

Figure 2A:
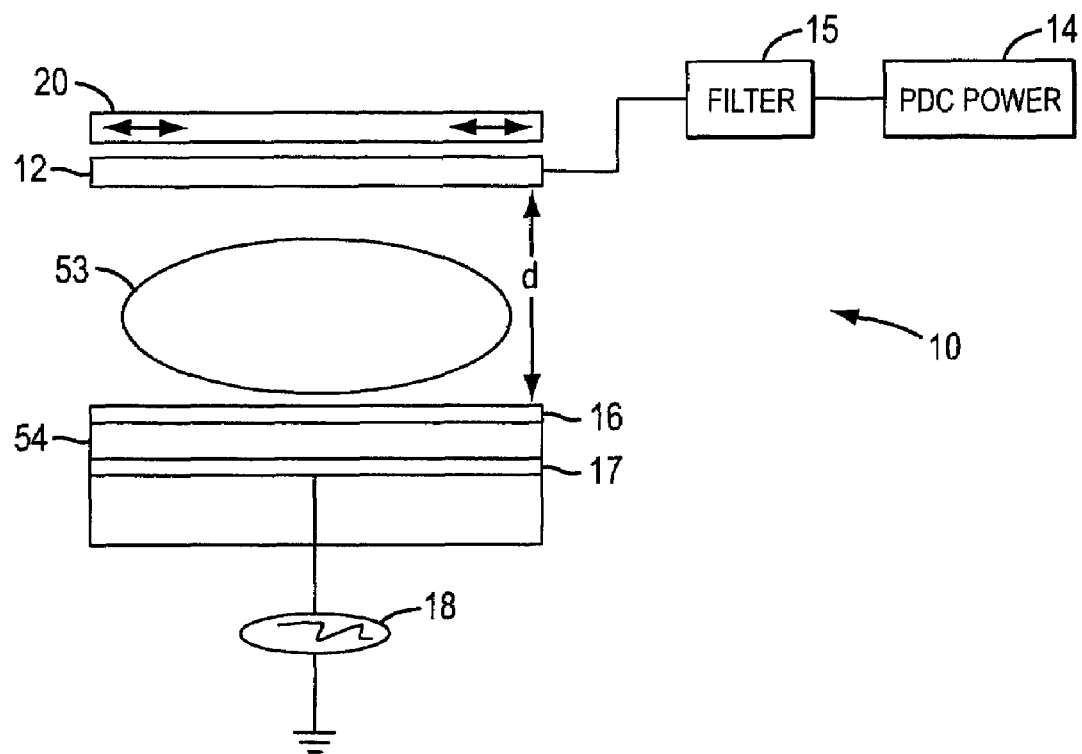
FIGS. 2A and 2B illustrate a PVD reactor for depositing thermal barrier layers according to the present invention.
Figure 2B:
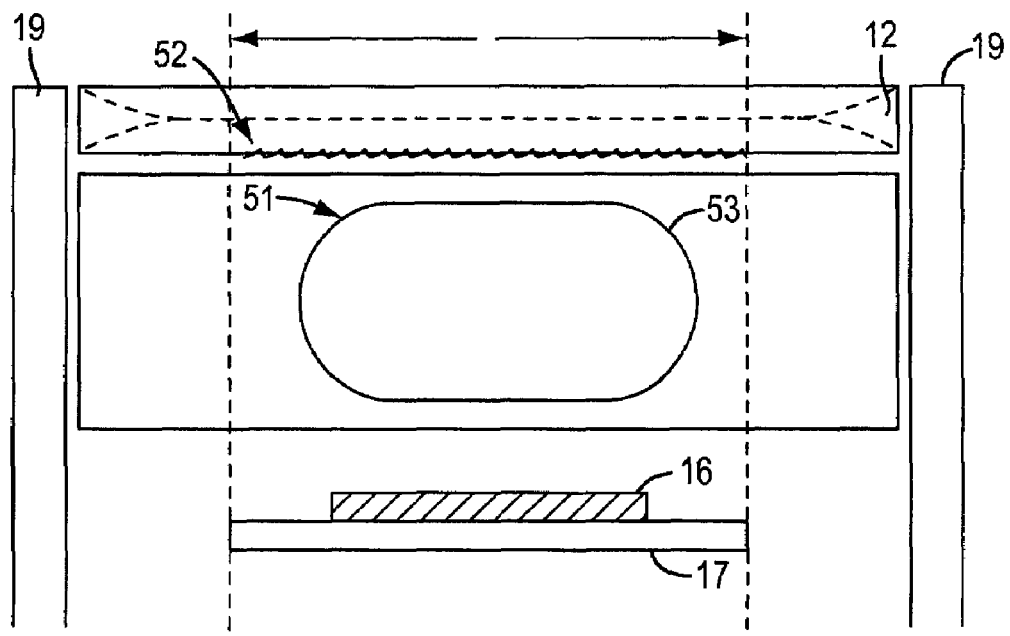

FIGS. 2A and 2B illustrate a reactor apparatus 10 for sputtering of material from a target 12 according to the present invention. In some embodiments, apparatus 10 may, for example, be adapted from an AKT-1600 PVD (400×500 mm substrate size) system from Applied Komatsu or an AKT-4300 (600×720 mm substrate size) system from Applied Komatsu, Santa Clara, Calif. The AKT-1600 reactor, for example, has three or four deposition chambers connected by a vacuum transport chamber. These AKT PVD reactors can be modified such that pulsed DC power is supplied to the target and RF power is supplied to the substrate during deposition of a material film.

Apparatus 10 includes a target 12 which is electrically coupled through a filter 15 to a pulsed DC power supply 14. In some embodiments, target 12 is a wide area sputter source target, which provides material to be deposited on substrate 16. Substrate 16 is positioned parallel to and opposite target 12. Target 12 functions as a cathode when power is applied to it and is equivalently termed a cathode. Application of power to target 12 creates a plasma 53. Substrate 16 is capacitively coupled to an electrode 17 through an insulator 54. Electrode 17 can be coupled to an RF power supply 18. Magnet 20 is scanned across the top of target 12.

For pulsed reactive dc magnetron sputtering, as performed by apparatus 10, the polarity of the power supplied to target 12 by power supply 14 oscillates between negative and positive potentials. During the positive period, the insulating layer on the surface of target 12 is discharged and arcing is prevented. To obtain arc free deposition, the pulsing frequency exceeds a critical frequency that depend on target material, cathode current and reverse time. High quality oxide films can be made using reactive pulse DC magnetron sputtering in apparatus 10.

Pulsed DC power supply 14 can be any pulsed DC power supply, for example an AE Pinnacle plus 10K by Advanced Energy, Inc. With this example supply, up to 10 kW of pulsed DC power can be supplied at a frequency of between 0 and 350 KHz. The reverse voltage is 10% of the negative target voltage. Utilization of other power supplies will lead to different power characteristics, frequency characteristics and reverse voltage percentages. The reverse time on this embodiment of power supply 14 can be adjusted between 0 and 5 μs.

Filter 15 prevents the bias power from power supply 18 from coupling into pulsed DC power supply 14. In some embodiments, power supply 18 is a 2 MHz RF power supply, for example can be a Nova-25 power supply made by ENI, Colorado Springs, Colo.

Therefore, filter 15 is a 2 MHz band rejection filter. In some embodiments, the band-width of the filter can be approximately 100 kHz. Filter 15, therefore, prevents the 2 MHz power from the bias to substrate 16 from damaging power supply 18.

However, both RF and pulsed DC deposited films are not fully dense and most likely have columnar structures. These columnar structures are detrimental for optical wave guide applications due to the scattering loss caused by the structure. By applying a RF bias on wafer 16 during deposition, the deposited film can be dandified by energetic ion bombardment and the columnar structure can be substantially eliminated.

In the AKT-1600 based system, for example, target 12 can have an active size of about 675.70×582.48 by 4 mm in order to deposit films on substrate 16 that have dimensions of about 400×500 mm. The temperature of substrate 16 can be held at between −50C. and 500C. The distance d between target 12 and substrate 16 can be about 3 and about 9 cm. Process gas can be inserted into the chamber of apparatus 10 at a rate up to about 200 sccm while the pressure in the chamber of apparatus 10 can be held at between about 0.7 and 6 millitorr. Magnet 20 provides a magnetic field of strength between about 400 and about 600 Gauss directed in the plane of target 12 and is moved across target 12 at a rate of less than about 20-30 sec/scan. In some embodiments utilizing the AKT-1600 reactor, magnet 20 can be a race-track shaped magnet with dimensions of about 150 mm by 600 mm.

Figure 3:
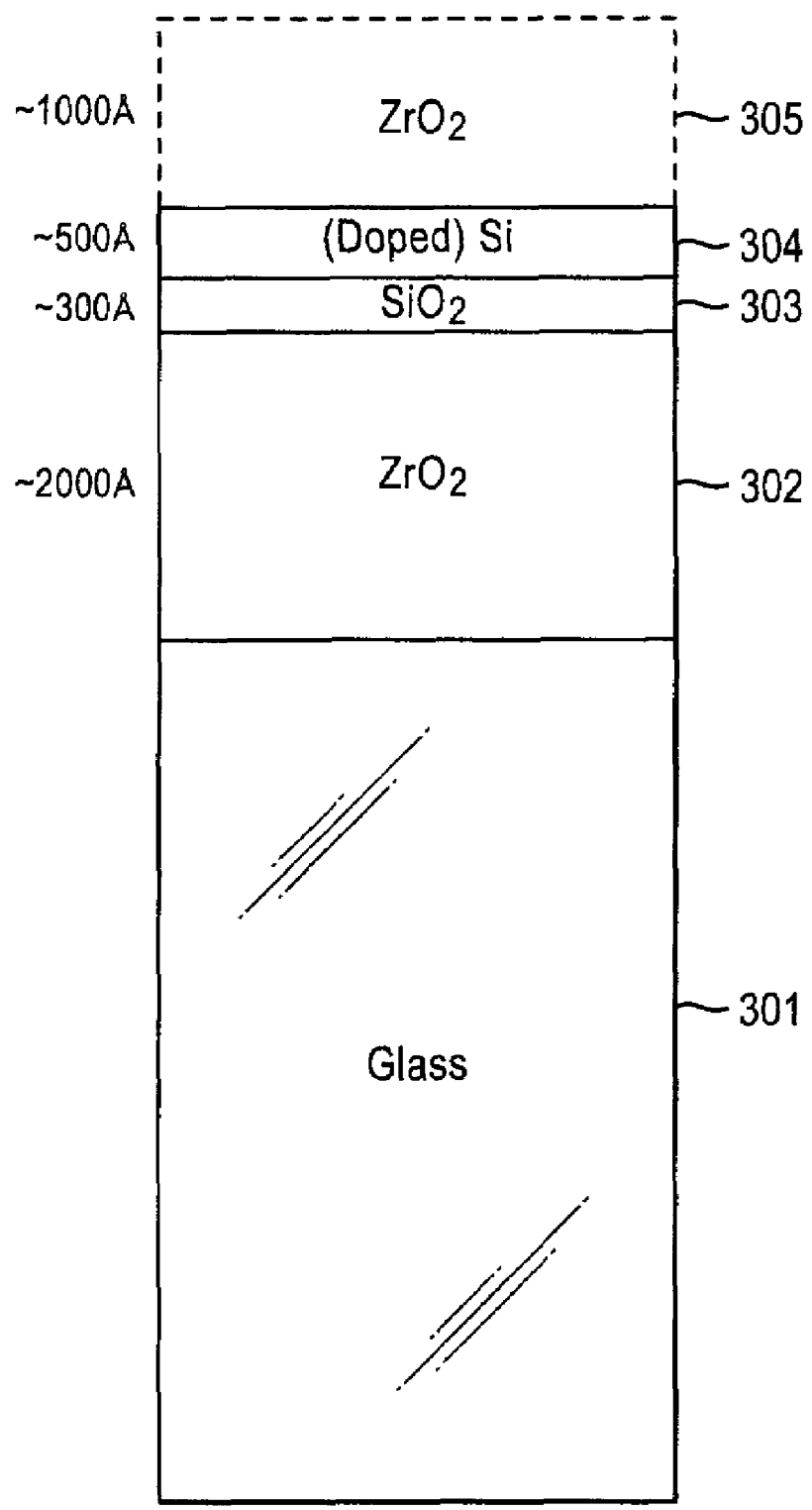
FIG. 3 illustrates a thermal barrier layer in accordance with the present invention.

FIG. 3 shows a thermal barrier layer according to the present invention. A thermal barrier layer 302 deposited on a substrate 301. Substrate 301 shown in FIG. 3 can be, for example, glass. A $SiO_2$ layer 303 is deposited on thermal barrier layer 302. In some cases a doped silicon layer 304 can be deposited over $SiO_2$ layer 304 and a second zirconia layer 305 is deposited over $SiO_2$ layer 304. In some embodiments, layer 302 can be about 2000 Angstroms, layer 303 can be about 300 Angstroms, layer 304 can be about 500 Angstroms, and layer 305 can be about 1000 Angstroms. A layer structure such as that shown in FIG. 3 is applicable to high-performance LTPS displays. Due to the high thermal resistivity of zirconia layer 302, layers 303 and 304 can be heated longer and cool slower, resulting in larger grain-growth, reduced surface roughness, and reduced ELC energy fluence. Additionally, due to the addition of layer 305 a de-gass step can be eliminated, a dense film with uniform thickness can be produced, and doping can be better controlled.

In some embodiments only the lower layer of zirconia, layer 302, is applied and silicon layer 304 is recrystallized by direct absorption of laser light. In a second embodiment, upper zirconia layer 305 can be deposited and the silicon is heated by absorption and conduction of a pre-selected thickness of zirconia, for example about 1000 Angstroms. In either case the recrystallization can be carried out either before or after patterning of the silicon.

FIG. 3 shows the inclusion of at least one layer of silicon dioxide, layer 303. As an under layer to the silicon, silica layer 303 acts as a lower dielectric where a transistor can subsequently be formed. By inclusion in the thermal barrier sandwich, silica layer 303 is annealed so that the gate region leakage is reduced. The zirconia thermal barrier layer 305 is annealed during the recrystallization of the amorphous silicon and can act as the gate for a formed transistor.

Figure 4:
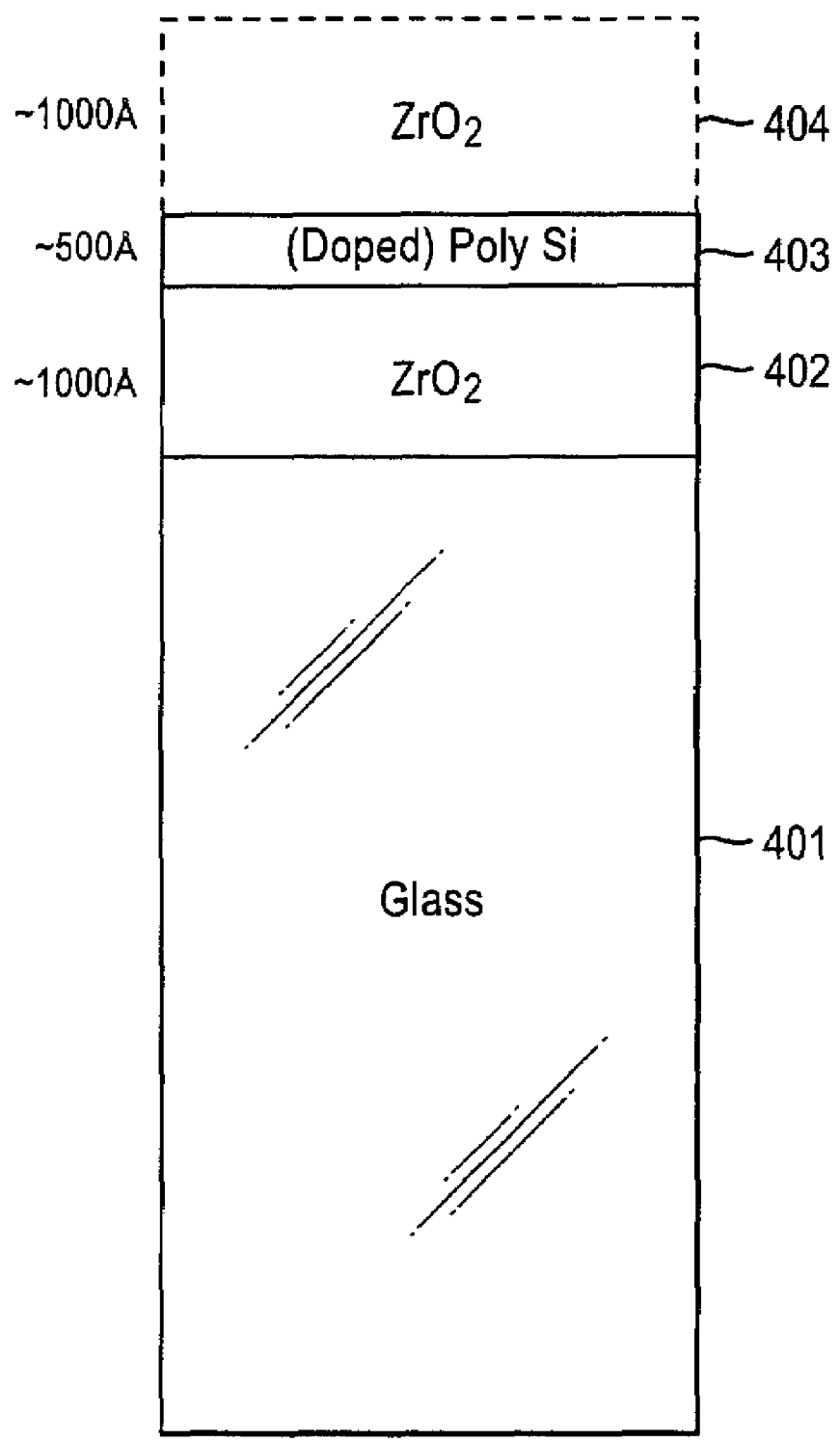
FIG. 4 illustrates another embodiment of a thermal barrier layer arrangement according to the present invention.

FIG. 4 shows another film stack 400 according to the present invention. Film stack 400 includes a zirconia layer 402 and an amorphous silicon layer 403 deposted over a glass substrate 401. In some embodiments, stack 400 further includes a second zirconia layer 404 deposited over the amorphous silicon layer 403. As shown in FIG. 4, zirconia layers 402 and 403 can be about 1000 Angstroms thick while amorphous silicon layer 403 can be about 500 Angstroms thick. One skilled in the art will recognize that the layer thicknesses given here are for example only and a wide range of layer thicknesses can be utilized.

In stack 400, the thermal barrier zirconia layer 402 can also be utilized as a dielectric layer. In some embodiments, stack 400 can further include a catalyst layer, such as nickel for example, deposited between lower zirconia layer 402 and amorphous silicon layer 403 to form polysilicon by means of a low temperature solid phase recrystallization process.

Embodiments of stack 400 shown in FIG. 4 can be utilized to form low-cost LTPS FPDs. Lower threshold voltages and higher performing TFTs can be obtained utilizing the thinner zirconia layer 404. Further, impurities concentrations and crystallization of amorphous polysilicon layer 403 can be better controlled resulting in more efficient devices.

Figure 5:
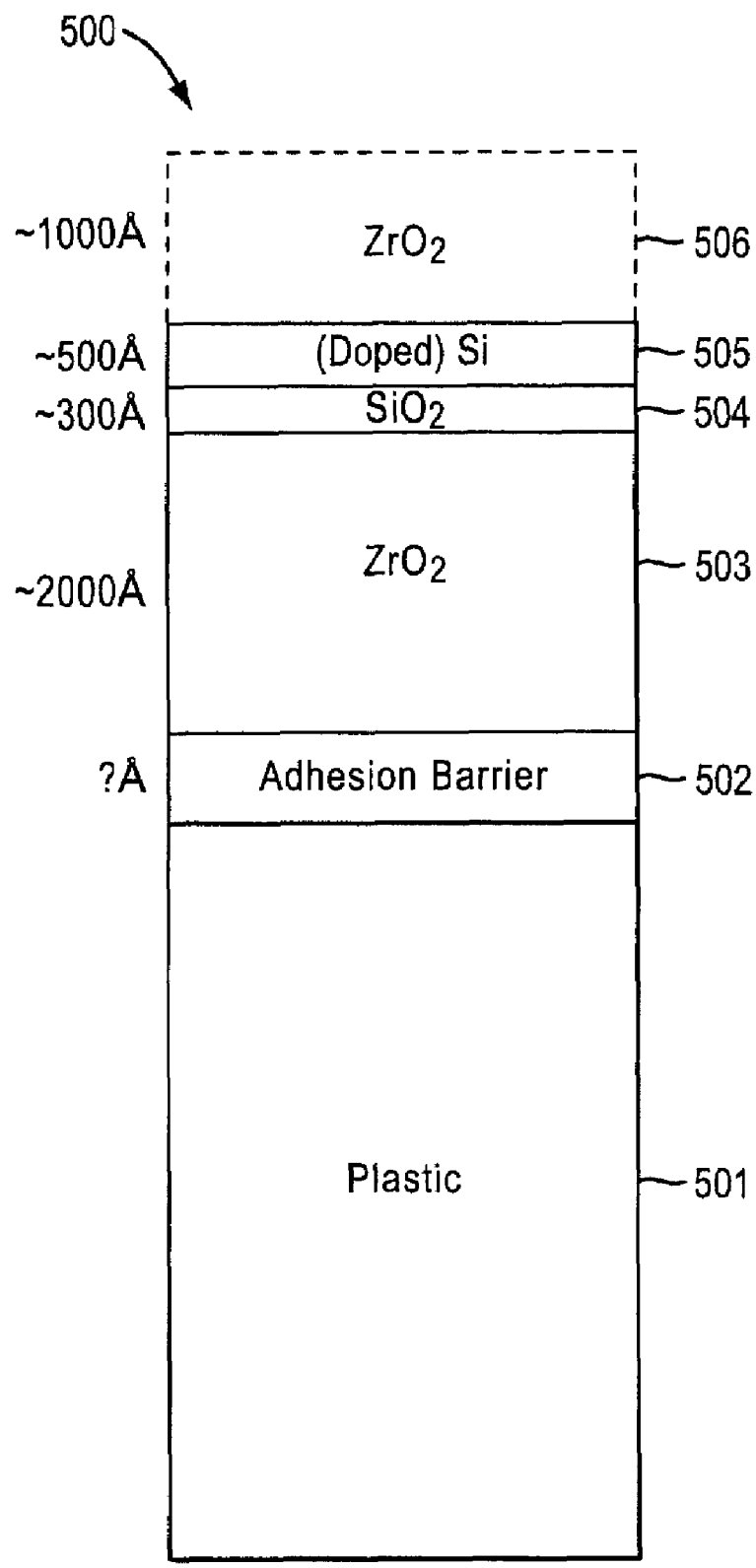
FIG. 5 illustrates another embodiment of a thermal barrier layer arrangement according to the present invention.

FIG. 5 shows another film stack 500 according to the present invention. In film stack 500, a plastic substrate 501 is utilized. Further, a barrier film 502 is placed on the plastic substrate. A zirconia thermal barrier layer 503 is deposited over the barrier film 502. A $SiO_2$ layer 504 and doped Si layer 505 are then deposited over thermal layer 503. In some embodiments, a second zirconia layer 506 can be deposited over layers 504 and 505.

In some embodiments, barrier film 502 can be an amorphous alumina silicate film deposited as disclosed in U.S. application Ser. No. 10/101,863, incorporated into this disclosure by reference above, or U.S. application Ser. No. 09/903,050, also incorporated into this disclosure by reference above.

Layer stack 500 as shown in FIG. 5 can enable low-cost, light rugged LCDs. High efficiency, resulting in lower threshold voltages, can be controlled by thinner barrier layer 506 and lower impurity levels by using layer 503. Additionally, low cost plastic can be utilized in formation.

As illustrated in FIGS. 3, 4 and 5, zirconia layers of about 1000 to about 2000 Angstroms can be utilized.

Figure 6:
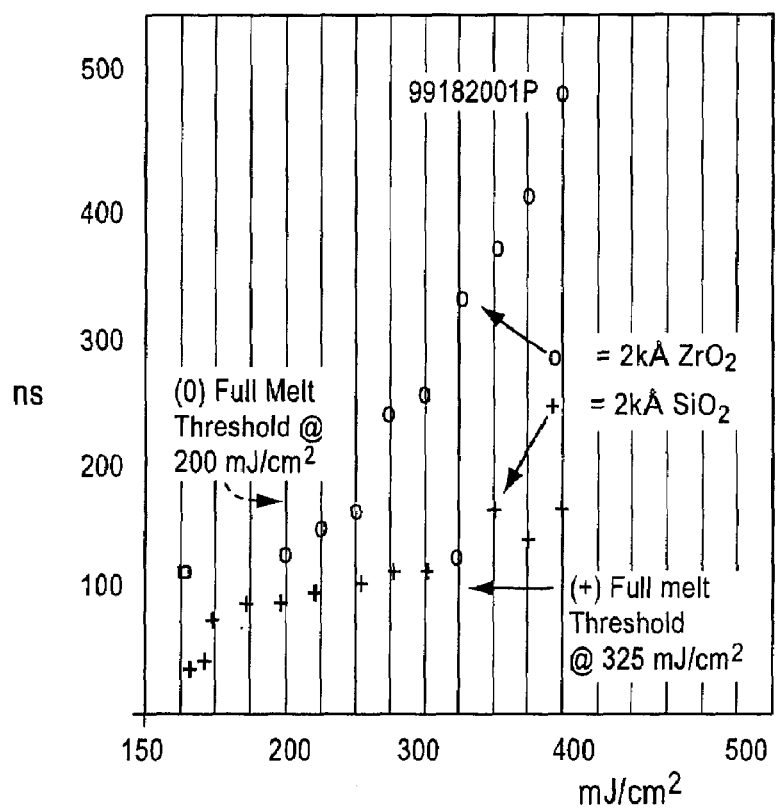
FIG. 6 illustrates thermal barrier properties of zirconia layers formed according to the present invention.

FIG. 6 shows the liquid lifetime in nanoseconds due to the excimer laser crystallization (ELC) of a 500 Ang. thick amorphous silicon ($\alpha$-si) layer on a silica layer 2000 Ang. thick and also on a 2000 Ang. Thick layer of zirconia as a function of the laser power in units of milli Jouls per centimeter squared.

As shown in FIG. 6, where the $\alpha$-Si is formed on the silica layer, a laser power of about 325 $mJ/cm^2$ is required to achieve $\alpha$-Si full melt threshold. However, where the $\alpha$-Si is formed on the zirconia layer, a laser power of only about 200 mJ/cm2 is required to achieve the $\alpha$-Si melt threshold. Therefore, presence of the thermal barrier layer reduced the power requirement for the ELC of the $\alpha$-Si. At ELC power below the FMT of the $\alpha$-Si formed on the silica layer, the $\alpha$-Si formed on the zirconia demonstrates a prolonged melt duration, and lower cooling rate which results in larger c-Si grains and higher mobility. Due to the prolonged melt duration and lower cooling rates, surface roughness is reduced and lower temperature substrates such as plastics can also be utilized.

Figure 7:
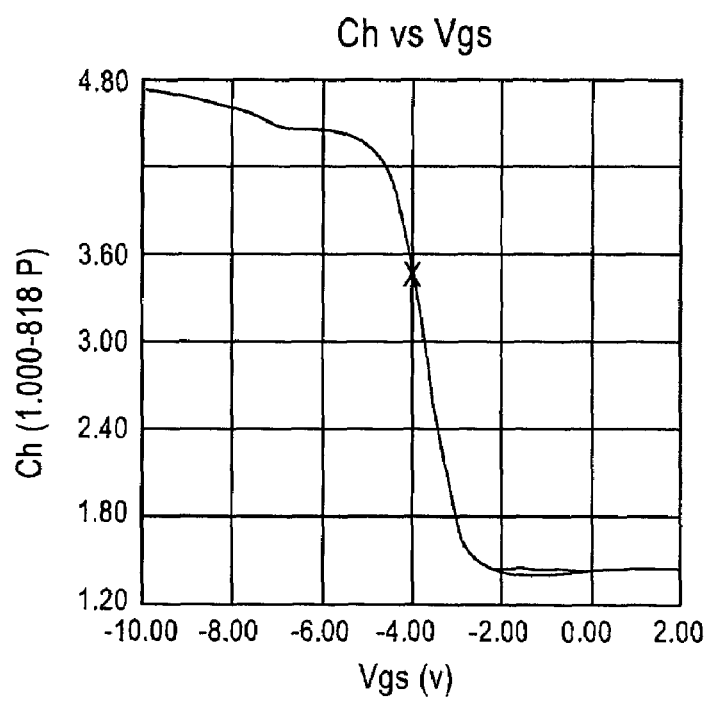
FIG. 7 illustrates gate dielectric properties of zirconia layers formed according to the present invention.

FIG. 7 shows the CV curve for stabilized zirconia layer according to the present invention. It demonstrates a lower $D_{it}$ or interface traps than a sputtered silica layer (e.g., $10^{11}/cm^2ev$ for zirconia versus $10^{12}/cm^2ev$ for sputtered silica), a flat band of –4 Volts, and a higher K value (about 8 to 25) for a lower deposition temperature (70° C.), suitable for use as a gate oxide. Sputtered silica demonstrated a dielectric constant K of 4 at a deposition temperature of about 280° C.

Table I shows the level of impurities of an as deposited $\alpha$-Si layer according to the present invention. About 2500 Angstroms of Silicon film was deposited on a zirconia layer deposited according to the present invention. In addition to the low impurity levels displayed, very high thickness non-uniformity can be achieved. In one test, only about a ±2.28% thickness non-uniformity on a 500 Angstrom film was demonstrated.

Table 2 shows as deposited properties of sputtered $\alpha$-Si and silicon dioxide layers deposited according to the present application. Impurity levels and the various layers of films deposited on thermal barrier layers according to the present invention are shown.

In accordance with the present invention, a zirconia thermal barrier layer is deposited over a substrate. Other layers, such as for example those of silicon dioxide and amorphous silicon, can then be deposited over the zirconia thermal barrier layer.

A Zirconia thermal barrier layer is formed by forming a ceramic target of zirconia or a metallic target of substantially zirconia metal. U.S. application Ser. No. 09/903,050 discusses ceramic target formation according to the present invention while U.S. application Ser. No. 10/101,341 discussed formation of metallic targets. In general, one or more constituent of zirconia or zirconia metal and desired impurity compounds are mixed, for example by mixing in a ball mill and the mixture is isostatically pressed or hipped to form the target. The target is utilized in a deposition chamber such as that shown in FIGS. 2A and 2B. Processes for depositing materials in that chamber is further described in U.S. application Ser. Nos. 10/101,863 and 09/903,053. Each of U.S. application Ser. Nos. 10/101,341, 10/101,863, and 09/903,053 is herein incorporated by reference in its entirety.

Additionally, Zirconia thermal layers are further discussed in U.S. Provisional application Ser. No. 60/337,938, filed on Nov. 9, 2001, and from which this disclosure claims priority, herein incorporated by reference in its entirety.

Specific examples of depositions according to the present invention are described below.

EXAMPLES

Example 1

Deposition of a Stabilized Zirconia Layer

In one embodiment a ceramic stabilized zirconia sputter target is fabricated. Zirconia powder is mixed with yttria powder to form about an 8 to about a 12% yttria powder mix. The Zirconia powder and yttria powder are mixed in a ball mill and isostatically pressed to form the target. The isostatic pressing is performed at a temperature below about 1000° C.

and a pressure of above about 28 Kpsi. During degassing in vacuum at about 50° C., the target material turns a black, glassy material. The deposition can be performed according to processes discussed in U.S. application Ser. No. 09/903,050, for example, by RF reactive deposition. The deposition process parameters can be as follows between about 4 and about 6 kW of 13.56 MHz RF power on the target cathode, at about 3 to about 6 mTorr of system pressure, with a bias power of about 200 to about 600 Watts at about 2 MHz. Process gas flows can be about 60 to about 80 sccm $O_2$ and about 40 to about 20, respectively, sccms of Argon. A resulting 2000 Angstrom film is fully stoichiometric cubic stabilized zirconia having a smooth amorphous consistency and a surface roughness of about 2 to about 10 Angstrom (average).

According to another embodiment, a metallurgical target can be prepared with zirconium metal and about 8 to about 12% yttria metal powder. These powders are mixed in a ball mill and hipped at about 1000° C. at a pressure of about 28 kPsi to form the target. The sputter target is sputtered with a reactive pulsed DC process as described in U.S. application Ser. No. 10/101,863. The deposition process parameters can be as follows between about 4 and about 8 kW of 200 MHz pulsed DC power on the target cathode, at about 3 to about 6 mTorr of system pressure, with a bias power of about 200 to about 600 Watts at about 2 MHz. Process gas flows can be about 60 to about 80 sccm $O_2$ and about 40 to about 20, respectively, sccms of Argon. The resulting 2000 to 3000 Ang. zirconia film is fully stoichiometric cubic stabilized, amorphous and has a surface roughness of about 2 to about 10 Angstroms (average) and is suitable for use as a thermal barrier and gate oxide layer. Advantageously, a thicker film can be utilized for a plastic or other substrate has a lower softening point.

Example 2

Deposition of an Amorphous Silicon Layer on the Zirconia Layer

An amorphous silicon ($\alpha$-Si) layer is deposited according by pulsed DC deposition from a sputter target comprised as a plurality of crystalline silicon tiles. Such a film can be deposited as described in application Ser. No. 10/101,863 and application Ser. No. 09/903,050 and additionally in application Ser. No. 09/766,463, "Method of Producing Amorphous Silicon for Hard Mask and Waveguide Applications, filed on Jan. 19, 2001, herein incorporated by reference in its entirety. A 500 Angstrom silicon film having the properties similar to those shown in Table 1 and Table 2 results.

Example 3

Deposition of an Adhesion/Diffusion Layer on a Plastic Substrate at Low Temperature Deposition of a silica or aluminosilicate barrier film can be carried out, for example as described in U.S. application Ser. No. 10/101,863. Aluminum and silicon powder, in the cation ratio 92% silicon and 8% aluminum are mixed in a ball mill and HIPed at a temperature above about 600° C. at a pressure of about 20 kPsi. The resulting block is saw cut into tiles of 4 mm thickness and bonded so as to cover a water cooled titanium backing plate using indium solder. The substrate is clamped by electrostatic means to a table having both cooling means and electrical means. It is coated according to U.S. application Ser. No. 10/101,863. The resulting aluminosilicate layer provides excellent protection from the incursion of water and oxygen having an origin in the plastic substrate.

Example 4

Deposition of a Silicon Dioxide Layer

The silicon dioxide layer can be deposited by a process similar to the process of example 3, with the exception that the sputter target is formed by plasma spraying pure silicon powder onto the titanium backing plate.

The examples of the invention provided above are intended to be examples only and are not intended to be limiting. One skilled in the art will recognize various modifications that can be made in the invention. These modifications are intended to be within the scope and spirit of the invention. As such, the invention is limited only by the following claims.

TABLE I

|   | As-dep m-Si |
|---|---|
| H | <0.1% |
| Ar | <0.1% |
| O | 3.E+18 |
| N | 2.E+17 |
| C | 2.E+18 |
| B | 2.E+16 |
| P | 2.E+15 |
| Na | 1.E+15 |
| K | 1.E+16 |
| Li | 1.E+14 |
| In | 2.E+13 |
| Al | 1.E+16 |
| Ni | ND < 3E+15 |
| Cu | ND < 2E+15 |
| Ti | 2.E+18 |

TABLE II

|   | Feature | Specifications | | Measured By |
|---|---|---|---|---|
| Si | As-deposited order | 2 modes<br>< 470 cm$^{-1}$ | Between 200 and 600 cm$^{-1}$<br>$T_0$ peak position | Raman |
|   | Very low impurity levels | < 1 × 10$^{15}$ cm$^{-3}$<br>< 5 × 10$^{16}$ cm$^{-3}$<br>< 5 × 10$^{17}$ cm$^{-3}$<br>< 5 × 10$^{18}$ cm$^{-3}$ | Na, K (each)<br>B, P (each)<br>Al, Ni, Cu (each)<br>N, O, C (each) | SIMS |
|   | Low gas content | < 1 at –%<br>< 1 at –% | H<br>Ar | FTIR<br>SIMS |
|   | Uniform film thickness | < +/– 5% | Measured at 25 points with 10 mm edge exclusion | Ellipsometry |
|   | Smooth film surface<br>(5 μm × 5 μm area) | <5 Å Ra<br><50 Å Rmax | As-deposited<br>Note: stack up with undercoat | AFM |
|   | Doping | <5 × 10$^{16}$ cm$^{-3}$ | Intrinsic, n or p | SIMS |

TABLE II-continued

| | Feature | Specifications | | Measured By |
|---|---|---|---|---|
| | | | Boron or Phosphorus | |
| | Thickness | 500 Å | | Ellipsometry |
| $SiO_2$ | Good barrier property | $< 1 \times 10^{15}$ cm$^{-3}$ | Na in Si film after 2 hours at 500° C. (silicon on dielectric on Corning 1737 F unannealed) | SIMS |
| | Very low impurity levels | $< 1 \times 10^{15}$ cm$^{-3}$ | Na, K (each) | SIMS |
| | | $< 5 \times 10^{16}$ cm$^{-3}$ | B, P (each) | |
| | | $< 5 \times 10^{17}$ cm$^{-3}$ | Al, Ni, Cu (each) | |
| | Low gas content | < 1 at –% | Ar | SIMS |
| | Uniform film thickness | < +/– 10% | Measured at 25 points with 10 mm edge exclusion | Ellipsometry |
| | Film thickness | 3000 Å | | Ellipsometry |

We claim:

1. A method of forming a layer, comprising:
forming a conductive ceramic zirconia target;
depositing a zirconia layer on a low temperature material in a physical vapor deposition (PVD) chamber from the target, wherein the layer is deposited by:
applying pulsed direct current (DC) power to a target cathode of the physical vapor deposition (PVD) chamber through a band rejection filter that rejects radio frequency (RF) power at a frequency, and
applying an RF bias power at the frequency to a substrate, wherein the low temperature material is a material that is damaged at a melting temperature of amorphous silicon.

2. The method of claim 1, wherein forming the target includes
mixing zirconia powder with between 8 and 12% yttria powder; and
isostatic pressing the mixed powder.

3. The method of claim 1, wherein forming the target includes
mixing zirconium metal with about 8 to about 12% yttria metal powder; and
hot isostatic pressing the mixed powder.

4. The method of claim 3, wherein depositing a zirconia layer includes
applying between about 4 and about 8 kW of 200 MHz pulsed DC power on the target;
applying between about 3 and about 6 mTorr of system pressure to the PVD chamber;
applying about 200 to about 600 Watts at 2 MHz of bias power to the substrate on which the zirconia layer will be deposited.

5. The method of claim 4, further including
adding between about 60 and about 80 sccm of oxygen to the PVD chamber; and
adding between about 40 and about 20 sccm of Argon to the PVD chamber, wherein the total gas flow is about 100 sccm.

6. The method of claim 1, wherein the low temperature material is a glass or a plastic material.

* * * * *